United States Patent
Min

(10) Patent No.: US 7,541,954 B2
(45) Date of Patent: Jun. 2, 2009

(54) TOUCH CONTROL APPARATUS AND ANALOG-TO-DIGITAL CONVERTING APPARATUS AND METHOD THEREOF

(75) Inventor: Shawn Min, Tainan Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/998,094

(22) Filed: Nov. 28, 2007

(65) Prior Publication Data

US 2008/0129571 A1 Jun. 5, 2008

(30) Foreign Application Priority Data

Nov. 30, 2006 (TW) .............................. 95144379 A

(51) Int. Cl.
*H03M 1/22* (2006.01)
(52) U.S. Cl. ...................... 341/122; 341/118; 341/120; 341/155
(58) Field of Classification Search ......... 341/118–122, 341/155–172
See application file for complete search history.

(56) References Cited

U.S. PATENT DOCUMENTS

| | | | | |
|---|---|---|---|---|
| 4,305,071 A | * | 12/1981 | Bell et al. .................... | 345/176 |
| 4,353,552 A | * | 10/1982 | Pepper, Jr. .................... | 463/37 |
| 5,374,787 A | * | 12/1994 | Miller et al. ............. | 178/18.06 |
| 5,543,588 A | * | 8/1996 | Bisset et al. ............. | 178/18.06 |
| 5,841,078 A | * | 11/1998 | Miller et al. ............. | 178/18.06 |
| 6,246,394 B1 | * | 6/2001 | Kalthoff et al. ............. | 345/173 |
| 6,624,835 B2 | * | 9/2003 | Willig ........................ | 347/173 |
| 6,801,146 B2 | * | 10/2004 | Kernahan et al. ........... | 341/122 |
| 6,961,015 B2 | * | 11/2005 | Kernahan et al. ........... | 341/165 |
| 7,023,221 B1 | * | 4/2006 | Lin ............................ | 324/662 |
| 2007/0200831 A1 | * | 8/2007 | Wang ........................ | 345/173 |
| 2007/0257890 A1 | * | 11/2007 | Hotelling et al. ............ | 345/173 |

\* cited by examiner

*Primary Examiner*—Linh V Nguyen
(74) *Attorney, Agent, or Firm*—David N. Lathrop, Esq.; Gallagher & Lathrop

(57) ABSTRACT

Disclosed are an analog-to-digital converting apparatus, an analog-to-digital converting method and a touch control apparatus adapted to convert a divided voltage generated according to a power voltage and a ground voltage. The analog-to-digital converting apparatus includes a first sample-and-hold circuit for sampling and holding the divided voltage, a second sample-and-hold circuit for sampling and holding the power voltage, and an analog-to-digital converter coupled to the first and second sample-and-hold circuits. The analog-to-digital converter converts the divided voltage from the first sample-and-hold circuit to a digital value according to the power voltage held by the second sample-and-hold circuit and the ground voltage. The first and second sample-and-hold circuits sample the divided voltage and the power voltage before the analog-to-digital converter converts the divided voltage, and hold the sampled divided voltage and the sampled power voltage at least during conversion of the divided voltage by the analog-to-digital converter.

20 Claims, 9 Drawing Sheets

US 7,541,954 B2

TOUCH CONTROL APPARATUS AND ANALOG-TO-DIGITAL CONVERTING APPARATUS AND METHOD THEREOF

CROSS-REFERENCE TO RELATED APPLICATION

This application claims priority of Taiwanese application no. 095144379, filed on Nov. 30, 2006.

BACKGROUND OF THE INVENTION

1. Field of the Invention

The invention relates to a touch control apparatus and analog-to-digital converting apparatus and method thereof, more particularly to a touch control apparatus and analog-to-digital converting apparatus and method thereof that are not affected by power fluctuation.

2. Description of the Related Art

Referring to FIG. 1, a touch panel 11, which includes a resistor grid (not shown), is applied with a touch panel power voltage (TPVDD) and a touch panel ground voltage (TPGND) respectively at two first sides opposite to each other in a first direction (X) and respectively at two second sides opposite to each other in a second direction (Y) transverse to the first direction (X). When the touch panel 11 is pressed, based on the principle of voltage division through resistors, divided voltages according to the touch panel power voltage (TPVDD) and the touch panel ground voltage (TPGND) and corresponding to coordinates of the pressed position of the touch panel 11 in the first and second directions (X, Y) will be generated.

Referring to FIG. 2, a handheld mobile communications device that incorporates the touch panel 11 uses a successive approximation analog-to-digital converter 12 to convert a divided voltage corresponding to a coordinate of the touch panel 11 in one direction into a digital value. Another divided voltage corresponding to a coordinate of the touch panel 11 in the other direction is also converted into a digital value in the same manner.

Through a binary search scheme, the successive approximation analog-to-digital converter 12 generates a significant bit, starting from the most significant bit to the least significant bit, for each half clock-pulse cycle. Therefore, if the digital value has N bits, N/2 clock-pulse cycles are required to complete the conversion.

The successive approximation analog-to-digital converter 12 includes a digital-to-analog (D/A) converting unit 121, a comparing unit 122, and a control unit 123. The D/A converting unit 121 converts a digital value from the control unit 123 into a comparison voltage ranging between the touch panel power voltage (TPVDD) and the touch panel ground voltage (TPGND). The comparing unit 122 compares an input voltage (which is a divided voltage generated by the touch panel 11) with the comparison voltage from the D/A converting unit 121. Based on the comparison result determined by the comparing unit 122, the control unit 123 adjusts the digital value that is provided to the D/A converting unit 121.

If the input voltage source changes before the successive approximation analog-to-digital converter 12 is able to complete the conversion, the digital value thus converted will be erroneous. To alleviate this drawback, a sample-and-hold circuit 13 is provided between the touch panel 11 and the successive approximation analog-to-digital converter 12, as best shown in FIG. 3. The sample-and-hold circuit 13 samples a received voltage before conversion by the successive approximation analog-to-digital converter 12, and holds the sampled voltage during conversion by the successive approximation analog-to-digital converter 12.

However, when the handheld mobile communications device transmits and receives signals, there is interference to the touch panel power voltage (TPVDD) such that the touch panel power voltage (TPVDD) fluctuates. The divided voltage generated by the touch panel 11 has a linear response to fluctuation of the touch panel power voltage (TPVDD). When the sample-and-hold circuit 13 is not included (see FIG. 2), the ratio of the input voltage of the successive approximation analog-to-digital converter 12 to the touch panel power voltage (TPVDD) is not affected by fluctuation of the touch panel power voltage (TPVDD), and a correct digital value can be obtained. However, when the sample-and-hold circuit 13 is included (see FIG. 3), the ratio of the input voltage of the successive approximation analog-to-digital converter 12 to the touch panel power voltage (TPVDD) will be affected by fluctuation of the touch panel power voltage (TPVDD), and an incorrect digital value will be obtained.

SUMMARY OF THE INVENTION

Therefore, one object of the present invention is to provide an analog-to-digital converting apparatus that can prevent changes in an input voltage and fluctuation of a power voltage during a conversion period from affecting an output thereof.

Another object of the present invention is to provide an analog-to-digital converting method that can prevent changes in an input voltage and fluctuation of a power voltage during a conversion period from affecting an output thereof.

Yet another object of the present invention is to provide a touch control apparatus that can prevent changes in an input voltage and fluctuation of a power voltage during a period of analog-to-digital conversion from affecting an output thereof.

According to one aspect of the present invention, there is provided an analog-to-digital converting method for converting a divided voltage, which is generated according to a power voltage and a ground voltage. The analog-to-digital converting method comprises: sampling and holding the divided voltage; sampling and holding the power voltage; and converting the held divided voltage to a digital value according to the held power voltage and the ground voltage. Sampling of the divided voltage and the power voltage are conducted before the step of converting the held divided voltage, and holding of the sampled divided voltage and the sampled power voltage are conducted at least during the step of converting the held divided voltage.

According to another aspect of the present invention, there is provided an analog-to-digital converting apparatus for converting a divided voltage, which is generated according to a power voltage and a ground voltage. The analog-to-digital converting apparatus comprises a first sample-and-hold circuit for sampling and holding the divided voltage, a second sample-and-hold circuit for sampling and holding the power voltage, and an analog-to-digital converter coupled to the first and second sample-and-hold circuits. The analog-to-digital converter converts the divided voltage from the first sample-and-hold circuit to a digital value according to the power voltage held by the second sample-and-hold circuit and the ground voltage. The first and second sample-and-hold circuits sample the divided voltage and the power voltage before the analog-to-digital converter converts the divided voltage, and hold the sampled divided voltage and the sampled power voltage at least during conversion of the divided voltage by the analog-to-digital converter.

According to yet another aspect of the present invention, there is provided a touch control apparatus that comprises a divided voltage source and an analog-to-digital converting apparatus. The divided voltage source, such as a touch panel or an impedance grid, generates a divided voltage according to a power voltage and a ground voltage. The analog-to-digital converting apparatus includes a first sample-and-hold circuit coupled to the divided voltage source and operable to sample and hold the divided voltage, a second sample-and-hold circuit for sampling and holding the power voltage, and an analog-to-digital converter coupled to the first and second sample-and-hold circuits. The analog-to-digital converter converts the divided voltage from the first sample-and-hold circuit to a digital value according to the power voltage held by the second sample-and-hold circuit and the ground voltage. The first and second sample-and-hold circuits sample the divided voltage and the power voltage before the analog-to-digital converter converts the divided voltage, and hold the sampled divided voltage and the sampled power voltage at least during conversion of the divided voltage by the analog-to-digital converter.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
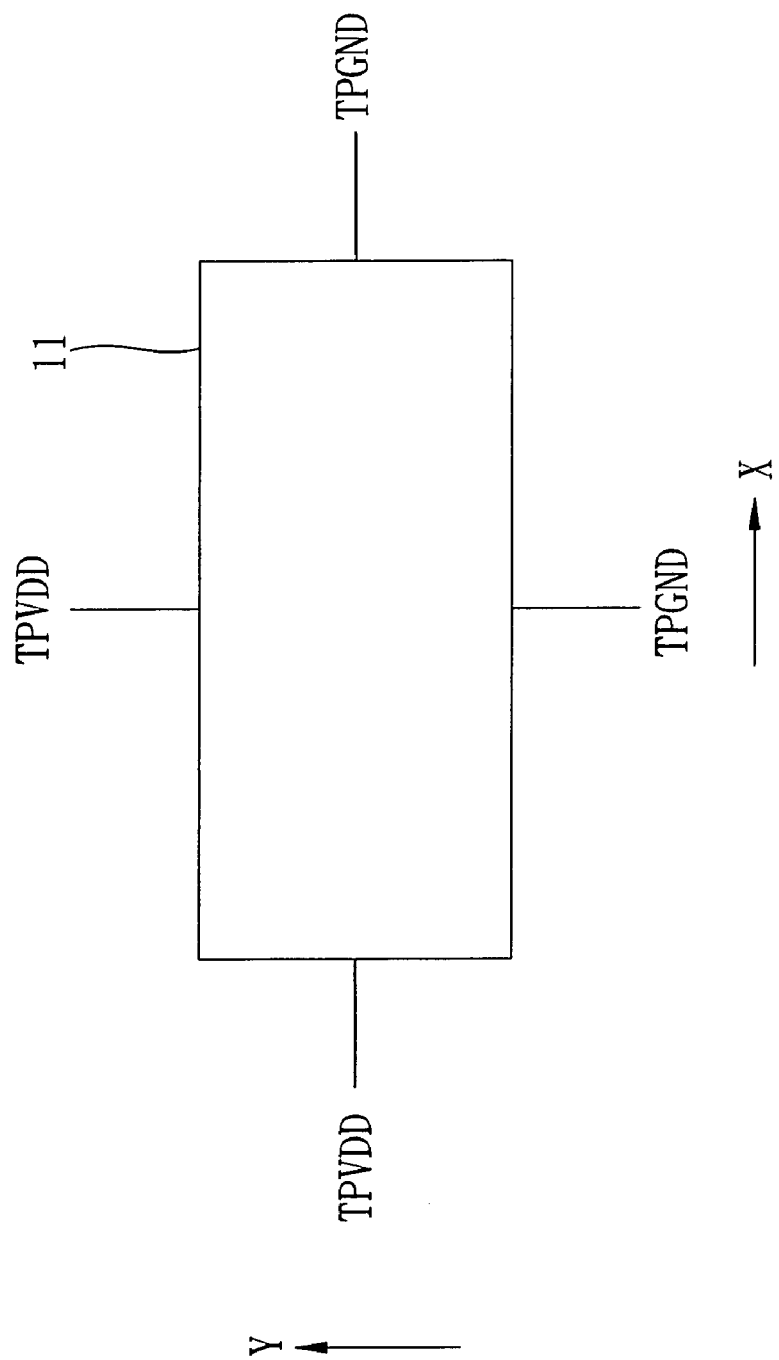
FIG. 1 is a schematic diagram of a conventional touch panel.
Figure 2:
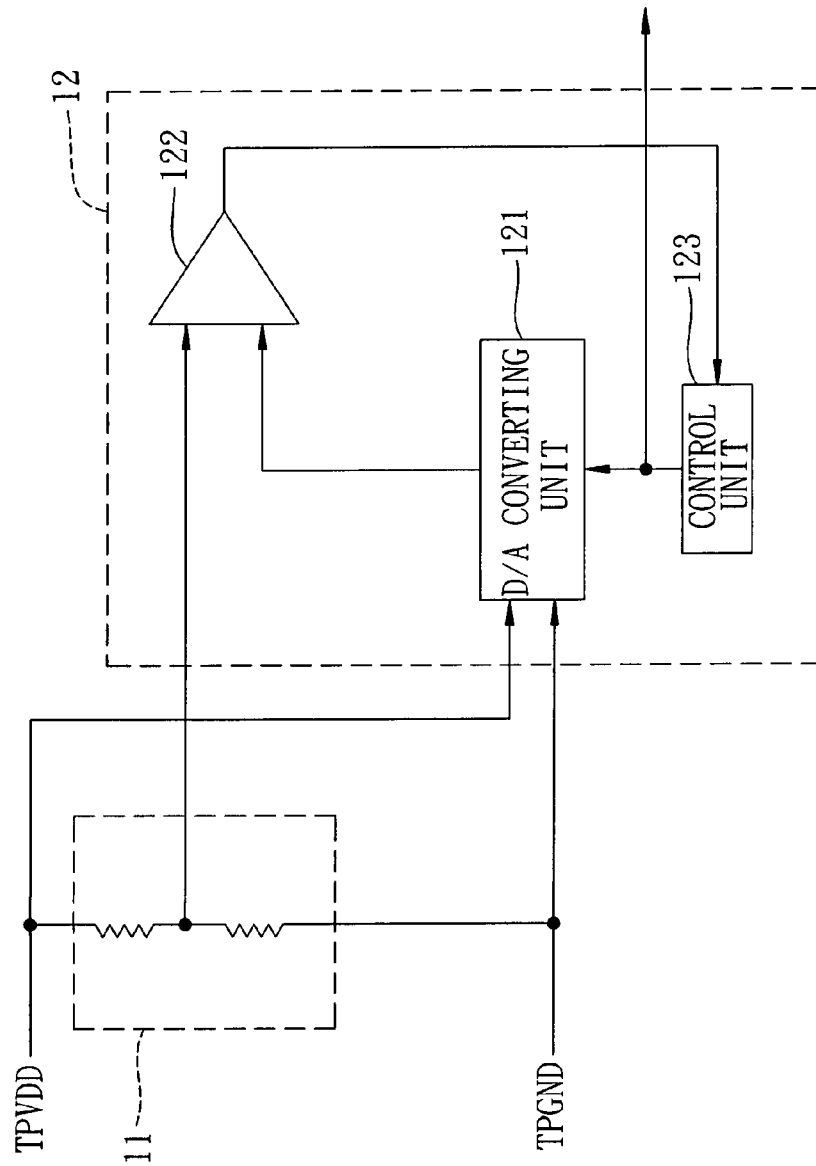
FIG. 2 is a circuit diagram illustrating a voltage generated by a touch panel being converted directly by a successive approximation analog-to-digital converter.
Figure 3:
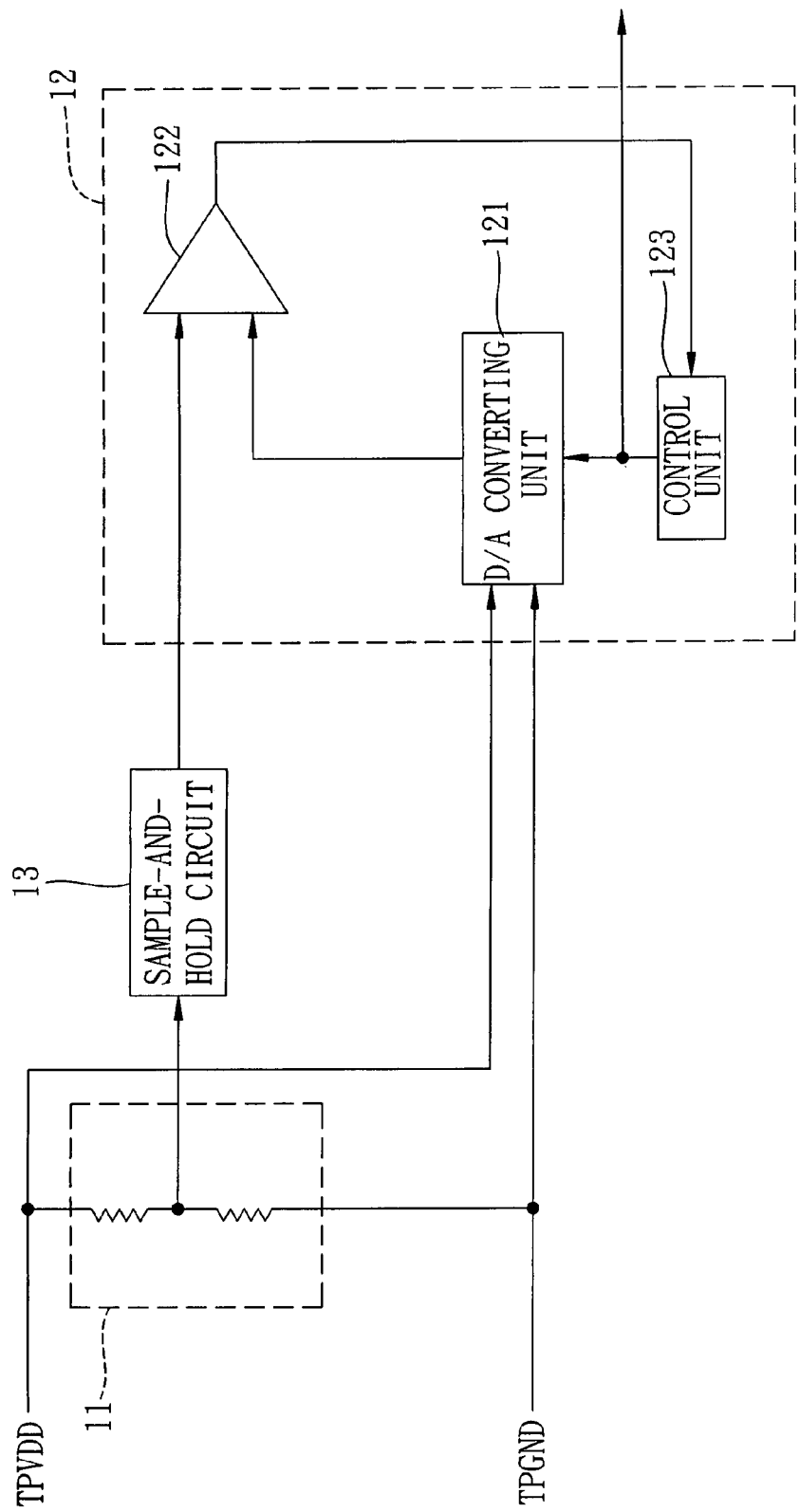
FIG. 3 is a circuit diagram illustrating a voltage generated by a touch panel being sampled and held before being converted by a successive approximation analog-to-digital converter.

Before the present invention is described in greater detail with reference to the accompanying preferred embodiments, it should be noted herein that like elements are denoted by the same reference numerals throughout the disclosure.

Figure 4:
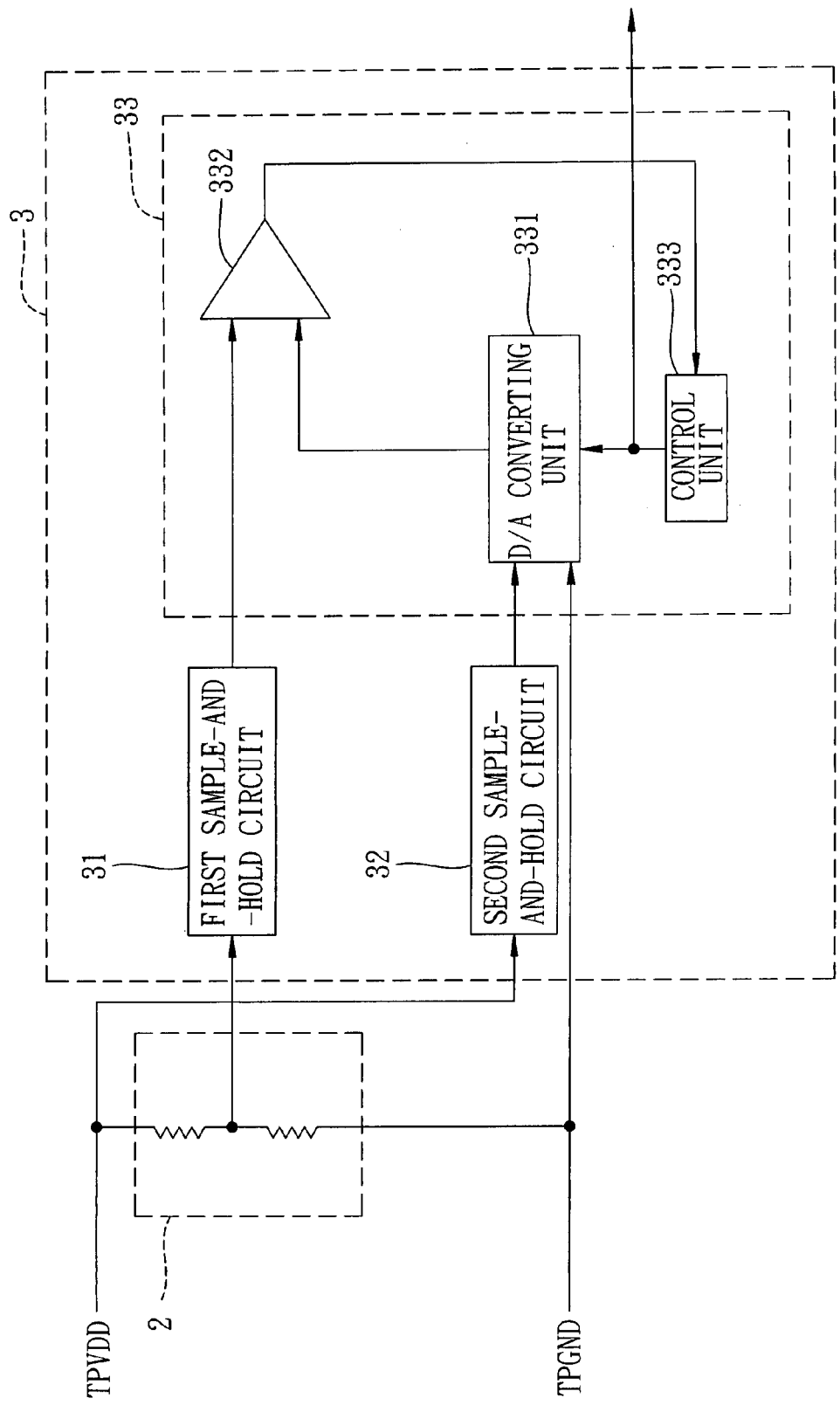
FIG. 4 is a circuit diagram illustrating the first preferred embodiment of an analog-to-digital converting apparatus according to the present invention.

Referring to FIG. 4, the first preferred embodiment of an analog-to-digital converting apparatus 3 according to the present invention is shown to be adapted for use with a touch panel 2. The touch panel 2 is applied with a touch panel power voltage (TPVDD) and a touch panel ground voltage (TPGND), and generates a divided voltage according to the touch panel power voltage (TPVDD) and the touch panel ground voltage (TPGND) and corresponding to a pressed position of the touch panel 2 in a known manner.

The analog-to-digital converting apparatus 3 includes a first sample-and-hold circuit 31 coupled to the touch panel 2, a second sample-and-hold circuit 32, and a known successive approximation analog-to-digital converter 33 coupled to the first and second sample-and-hold circuits 31, 32.

The first and second sample-and-hold circuits 31, 32 respectively sample the divided voltage from the touch panel 2 and the touch panel power voltage (TPVDD) before the successive approximation analog-to-digital converter 33 performs analog-to-digital conversion, and respectively hold the sampled voltages at least during the period of analog-to-digital conversion by the successive approximation analog-to-digital converter 33.

The successive approximation analog-to-digital converter 33 converts the sampled divided voltage held by the first sample-and-hold circuit 31 into a digital value according to the sampled touch panel power voltage held by the second sample-and-hold circuit 32 and the touch panel ground voltage (TPGND).

The successive approximation analog-to-digital converter 33 includes a digital-to-analog (D/A) converting unit 331, a comparing unit 332 and a control unit 333. Since successive approximation analog-to-digital converters are well known to those skilled in the art, they will not be detailed further for the sake of brevity.

Through the first and second sample-and-hold circuits 31, 32, during the period of analog-to-digital conversion by the successive approximation analog-to-digital converter 33, even if there is a change in the divided voltage generated by the touch panel 2, or if the touch panel power voltage (TPVDD) fluctuates, the voltages applied to the successive approximation analog-to-digital converter 33 are unaffected such that a correct digital value is obtained.

If the number of bits of the digital value is large, the comparing unit 332 of the successive approximation analog-to-digital converter 33 must be able to compare very small voltage differences. When the touch panel power voltage (TPVDD) fluctuates due to interference, the power voltage applied to the successive approximation analog-to-digital converter 33 also fluctuates due to the interference, which makes it easy for the comparing unit 332 to make errors when comparing very small voltage differences. Error correction cannot be performed if the successive approximation analog-to-digital converter 33 only generates one significant bit per unit time.

Figure 5:
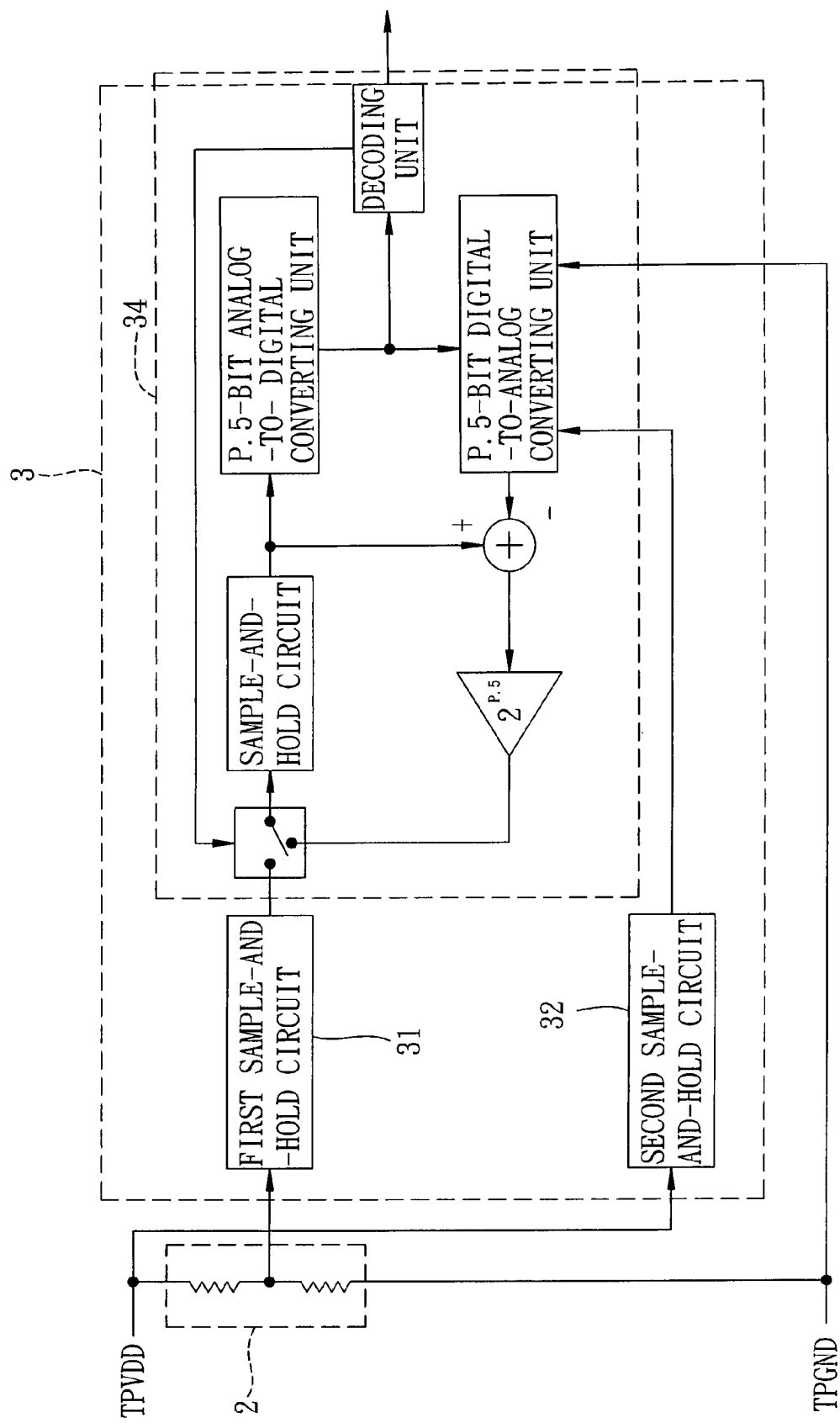
FIG. 5 is a circuit diagram illustrating the second preferred embodiment of an analog-to-digital converting apparatus according to the present invention.

Referring to FIG. 5, in the second preferred embodiment of an analog-to-digital converting apparatus 3 of the present invention, a cyclic analog-to-digital converter 34 is used to generate, for each half clock-pulse cycle, (P.5) bits starting from the most significant bit to the least significant bit, and to decode the bits thus generated so as to obtain the digital value. When P is a positive integer (e.g., P.5=1.5 or 2.5), the cyclic analog-to-digital converter 34 is able to perform error correction.

Figure 6:
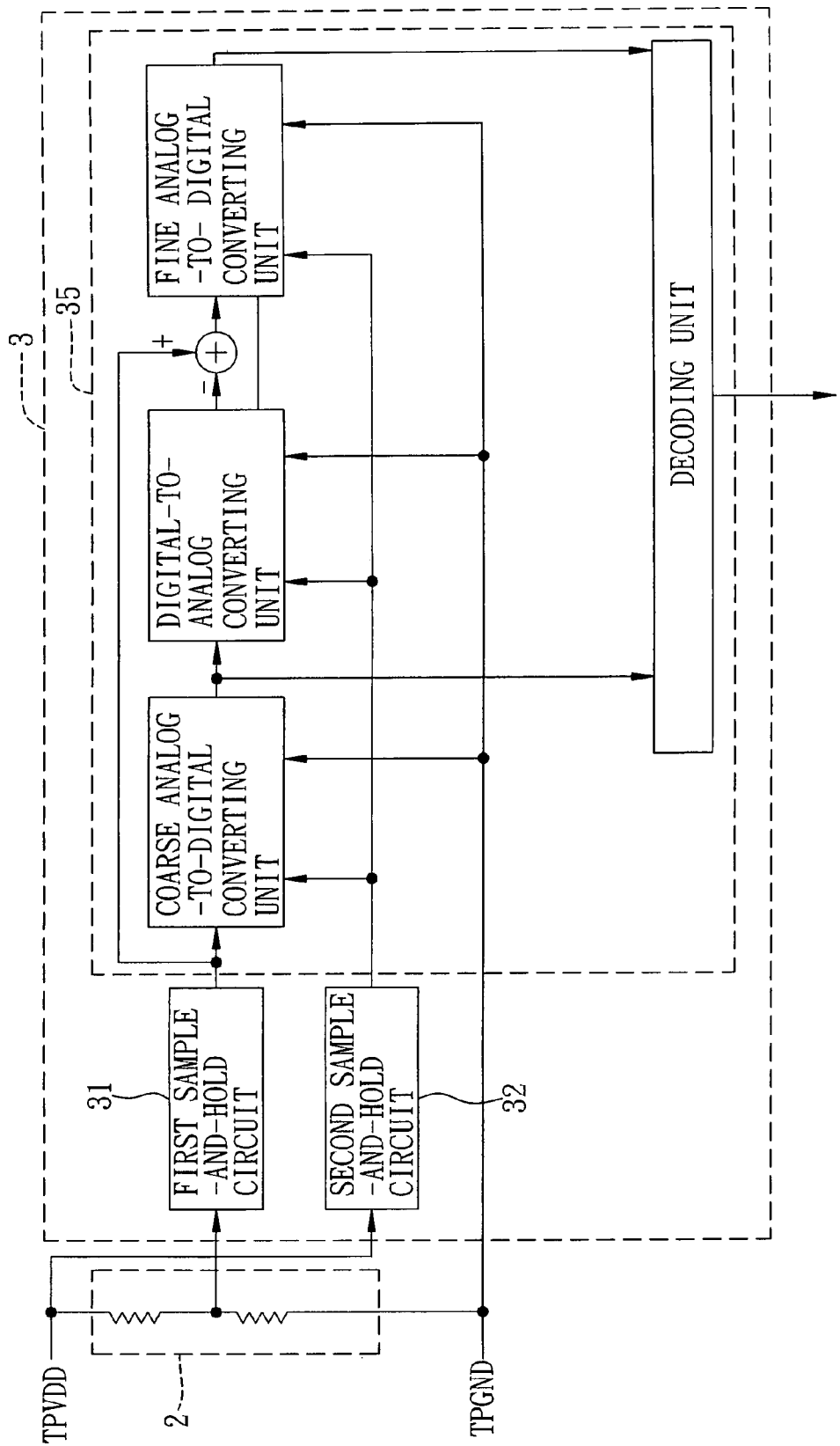
FIG. 6 is a circuit diagram illustrating the third preferred embodiment of an analog-to-digital converting apparatus according to the present invention.

Referring to FIG. 6, in the third preferred embodiment of an analog-to-digital converting apparatus 3 of the present invention, a sub-ranging analog-to-digital converter 35 is used to reduce resistor layout. The sub-ranging analog-to-digital converter 35 first generates higher-order bits, then generates lower-order bits, and finally decodes the bits thus generated so as to obtain the digital value. Furthermore, if a two-step analog-to-digital converter is used, the voltage used to generate the lower-order bits will be amplified first (the amplifier unit is not shown), and the lower-order bits are then generated according to the voltage held by the second sample-and-hold circuit 32 and the touch panel ground voltage (TPGND). Therefore, since larger voltage differences are compared, the possibility of error is reduced as compared to when very small voltage differences are compared.

Figure 7:
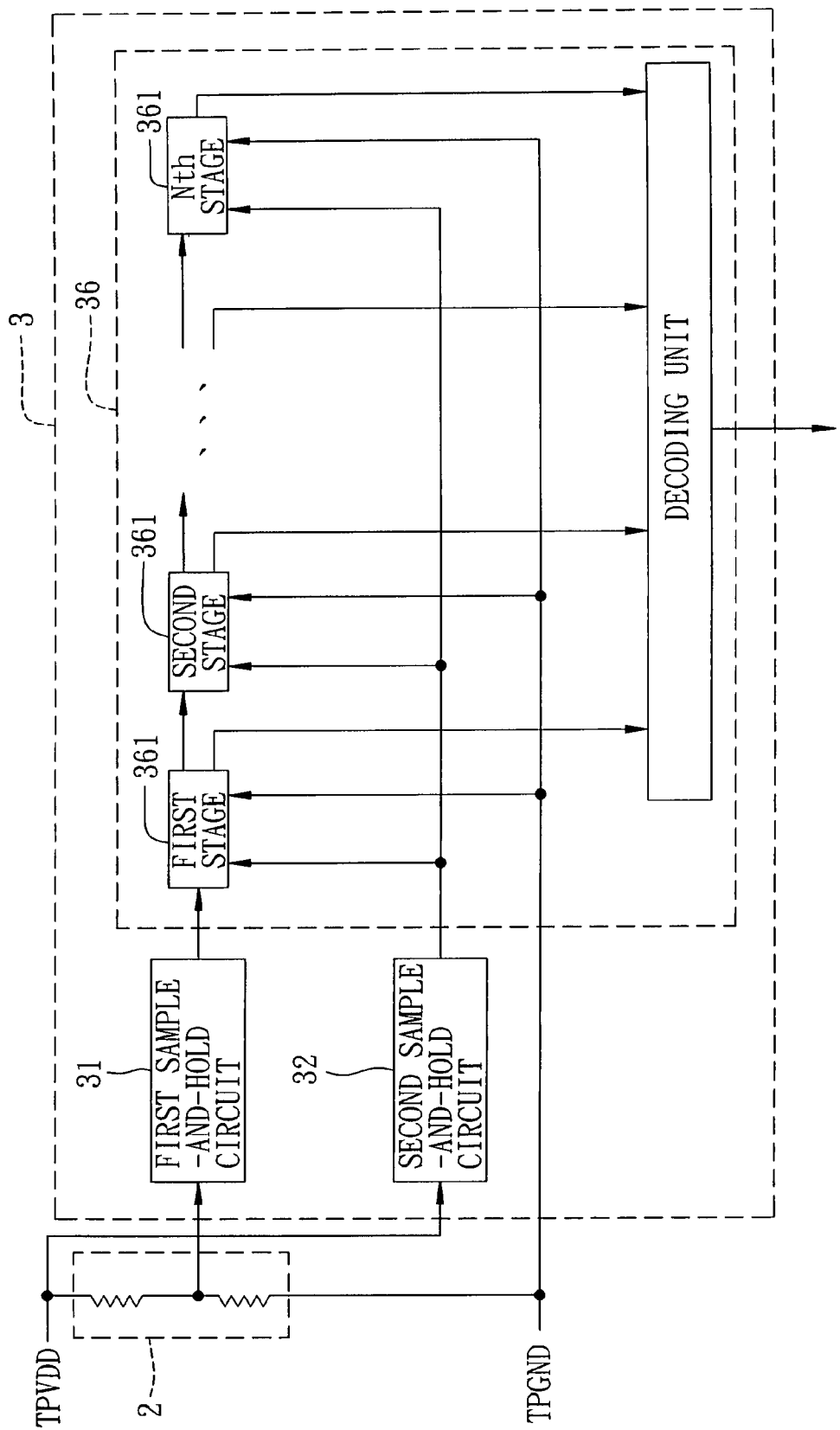
FIG. 7 is a circuit diagram illustrating the fourth preferred embodiment of an analog-to-digital converting apparatus according to the present invention.
Figure 8:
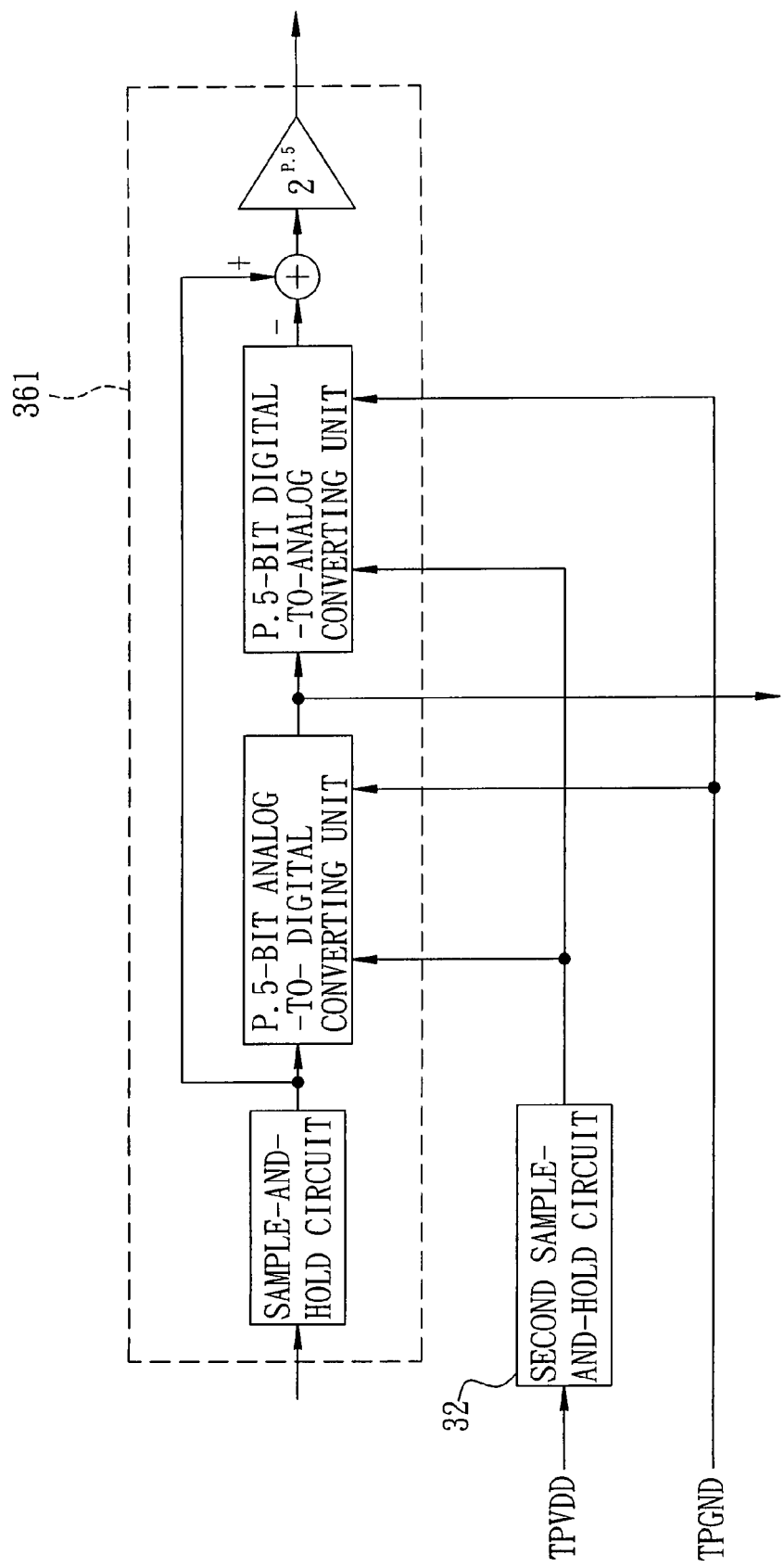
FIG. 8 is a circuit diagram illustrating one stage of an analog-to-digital converter of the fourth preferred embodiment.

Referring to FIGS. 7 and 8, in the fourth preferred embodiment of an analog-to-digital converting apparatus 3 of the present invention, a pipelined analog-to-digital converter 36 is used to generate, for each half clock-pulse cycle, (P.5) bits starting from the most significant bit to the least significant bit, and to decode the bits thus generated so as to obtain the digital value. When there are N bits in the digital value, the pipelined analog-to-digital converter 36 includes N stages 361. Since each stage 361 is able to sample and hold an input voltage, different stages are able to convert different voltages simultaneously. Regardless of the number of bits in the digital value, a digital value will be converted for each clock-pulse cycle. Likewise, when P is a positive integer (e.g., P.5=1.5 or 2.5), the pipelined analog-to-digital converter 36 is able to perform error correction.

It is noted that, aside from being applicable to the touch panel 2, this invention is also suitable for converting any divided voltage generated from a power voltage and a ground voltage. This invention can also be combined with any device that employs voltage division through impedances (such as the touch panel 2) to form a touch control apparatus.

Moreover, the analog-to-digital converter suitable for use in this invention is not limited to the abovementioned successive approximation analog-to-digital converter 33, cyclic analog-to-digital converter 34, sub-ranging analog-to-digital converter 35 and pipelined analog-to-digital converter 36.

Figure 9:
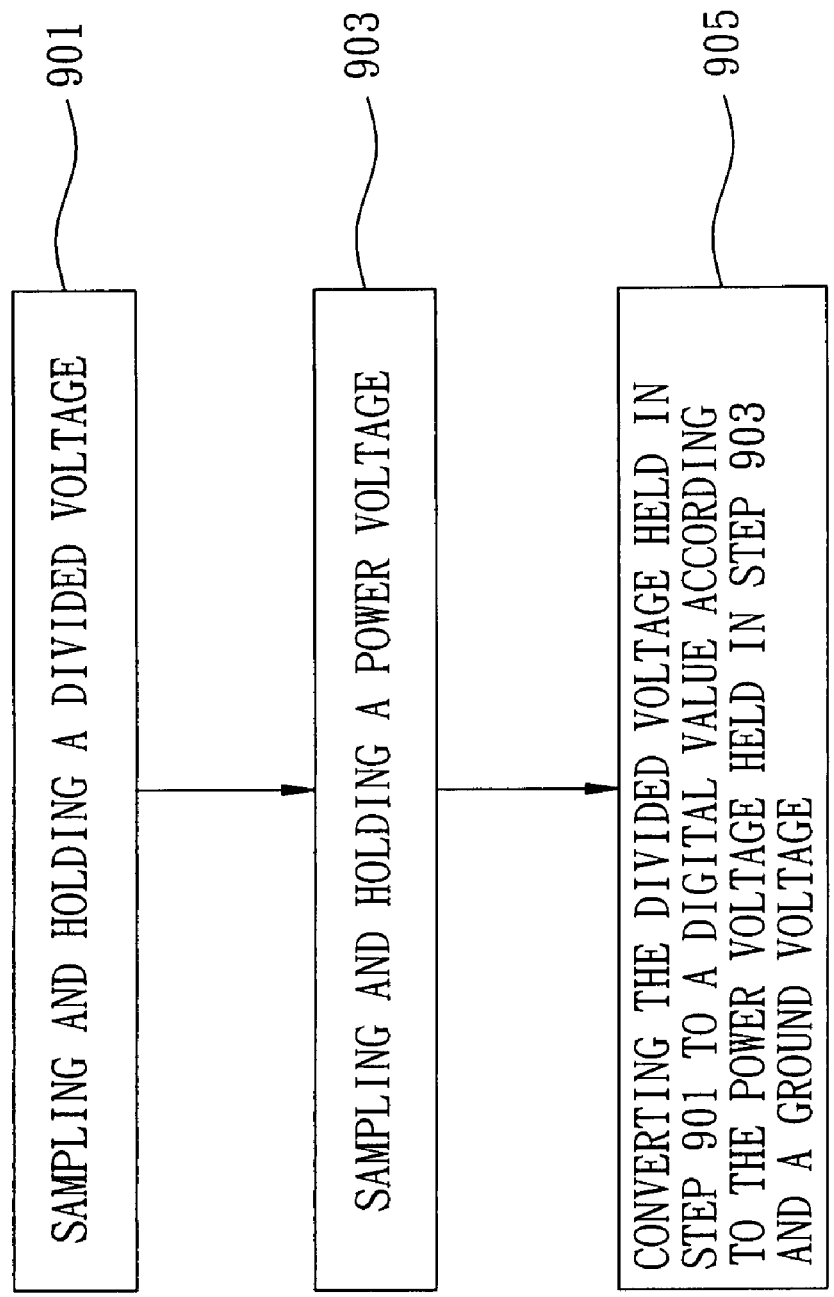
FIG. 9 is a flowchart of the preferred embodiment of an analog-to-digital converting method according to the present invention.

Referring to FIG. 9, the preferred embodiment of an analog-to-digital converting method according to the present invention is for converting a divided voltage, which is generated according to a power voltage and a ground voltage, and comprises the steps of:

Step 901: sampling and holding the divided voltage;
Step 903: sampling and holding the power voltage; and
Step 905: converting the divided voltage held in step 901 to a digital value according to the power voltage held in step 903 and the ground voltage.

Sampling of the divided voltage and the power voltage are conducted before step 905, and holding of the sampled divided voltage and the sampled power voltage are conducted at least during step 905.

In order to permit error correction, (P.5) bits are generated for each half clock-pulse cycle in step 905 of this embodiment in a known manner, where P is a positive integer.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An analog-to-digital converting method for converting a divided voltage which is generated according to a power voltage and a ground voltage, said analog-to-digital converting method comprising the steps of:

sampling and holding the divided voltage;
   sampling and holding the power voltage; and
   converting the held divided voltage to a digital value according to the held power voltage and the ground voltage;
   wherein sampling of the divided voltage and the power voltage are conducted before the step of converting the held divided voltage, and holding of the sampled divided voltage and the sampled power voltage are conducted at least during the step of converting the held divided voltage.

2. The analog-to-digital converting method as claimed in claim 1, wherein (P.5) bits are generated for each half clock-pulse cycle in the step of converting the held divided voltage, where P is a positive integer.

3. An analog-to-digital converting apparatus for converting a divided voltage which is generated according to a power voltage and a ground voltage, said analog-to-digital apparatus comprising:

a first sample-and-hold circuit for sampling and holding the divided voltage;
   a second sample-and-hold circuit for sampling and holding the power voltage; and
   an analog-to-digital converter coupled to said first and second sample-and-hold circuits, said analog-to-digital converter converting the divided voltage from said first sample-and-hold circuit to a digital value according to the power voltage held by said second sample-and-hold circuit and the ground voltage;
   wherein said first and second sample-and-hold circuits sample the divided voltage and the power voltage before said analog-to-digital converter converts the divided voltage, and hold the sampled divided voltage and the sampled power voltage at least during conversion of the divided voltage by said analog-to-digital converter.

4. The analog-to-digital converting apparatus as claimed in claim 3, wherein said analog-to-digital converter is a successive approximation analog-to-digital converter.

5. The analog-to-digital converting apparatus as claimed in claim 3, wherein said analog-to-digital converter is a cyclic analog-to-digital converter.

6. The analog-to-digital converting apparatus as claimed in claim 5, wherein said analog-to-digital converter generates (P.5) bits for each half clock-pulse cycle, where P is a positive integer.

7. The analog-to-digital converting apparatus as claimed in claim 3, wherein said analog-to-digital converter is a sub-ranging analog-to-digital converter.

8. The analog-to-digital converting apparatus as claimed in claim 3, wherein said analog-to-digital converter is a two-step analog-to-digital converter.

9. The analog-to-digital converting apparatus as claimed in claim 3, wherein said analog-to-digital converter is a pipelined analog-to-digital converter.

10. The analog-to-digital converting apparatus as claimed in claim 9, wherein said analog-to-digital converter includes a plurality of stages, each of which generates (P.5) bits for each half clock-pulse cycle, where P is a positive integer.

11. A touch control apparatus comprising:

a divided voltage source for generating a divided voltage according to a power voltage and a ground voltage; and
   an analog-to-digital converting apparatus including:
      a first sample-and-hold circuit coupled to said divided voltage source and operable to sample and hold the divided voltage;
      a second sample-and-hold circuit for sampling and holding the power voltage; and
      an analog-to-digital converter coupled to said first and second sample-and-hold circuits, said analog-to-digital converter converting the divided voltage from said first sample-and-hold circuit to a digital value according to the power voltage held by said second sample-and-hold circuit and the ground voltage;

wherein said first and second sample-and-hold circuits sample the divided voltage and the power voltage before said analog-to-digital converter converts the divided voltage, and hold the sampled divided voltage and the sampled power voltage at least during conversion of the divided voltage by said analog-to-digital converter.

12. The touch control apparatus as claimed in claim 11, wherein said analog-to-digital converter is a successive approximation analog-to-digital converter.

13. The touch control apparatus as claimed in claim 11, wherein said analog-to-digital converter is a cyclic analog-to-digital converter.

14. The touch control apparatus as claimed in claim 13, wherein said analog-to-digital converter generates (P.5) bits for each half clock-pulse cycle, where P is a positive integer.

15. The touch control apparatus as claimed in claim 11, wherein said analog-to-digital converter is a sub-ranging analog-to-digital converter.

16. The touch control apparatus as claimed in claim 11, wherein said analog-to-digital converter is a two-step analog-to-digital converter.

17. The touch control apparatus as claimed in claim 11, wherein said analog-to-digital converter is a pipelined analog-to-digital converter.

18. The touch control apparatus as claimed in claim 17, wherein said analog-to-digital converter includes a plurality of stages, each of which generates (P.5) bits for each half clock-pulse cycle, where P is a positive integer.

19. The touch control apparatus as claimed in claim 11, wherein said divided voltage source is a touch panel.

20. The touch control apparatus as claimed in claim 11, wherein said divided voltage source is an impedance grid.

* * * * *